(12) United States Patent
Ellavsky et al.

(10) Patent No.: US 9,087,172 B2
(45) Date of Patent: Jul. 21, 2015

(54) IMPLEMENTING ENHANCED NET ROUTING CONGESTION RESOLUTION OF NON-RECTANGULAR OR RECTANGULAR HIERARCHICAL MACROS

(71) Applicant: International Business Machines Corporation, Armonk, NY (US)

(72) Inventors: Matthew R. Ellavsky, Rochester, MN (US); Sean T. Evans, Rochester, MN (US); Timothy D. Helvey, Rochester, MN (US); Brandon E. Schenck, Rochester, MN (US); Jason L. Van Vreede, Trempealeau, WI (US); Bradley C. White, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/047,071

(22) Filed: Oct. 7, 2013

(65) Prior Publication Data
US 2015/0100937 A1 Apr. 9, 2015

(51) Int. Cl.
*G06F 17/50* (2006.01)

(52) U.S. Cl.
CPC ................................ *G06F 17/5077* (2013.01)

(58) Field of Classification Search
CPC .................................. G06F 9/455; G06F 17/50
USPC .......................................................... 716/113
See application file for complete search history.

(56) References Cited

U.S. PATENT DOCUMENTS

| | | |
|---|---|---|
| 5,798,936 A | 8/1998 | Cheng |
| 6,718,531 B2 | 4/2004 | Katayose |
| 7,096,436 B2 | 8/2006 | Bednar et al. |
| 7,103,863 B2 | 9/2006 | Riepe et al. |
| 7,225,116 B2 | 5/2007 | Harn |
| 7,313,776 B2 * | 12/2007 | Kaul et al. ..................... 716/113 |
| 8,112,733 B2 | 2/2012 | Frankle et al. |
| 8,151,228 B2 | 4/2012 | Ramachandran et al. |
| 8,386,984 B2 | 2/2013 | He et al. |
| 2009/0144687 A1 | 6/2009 | Andou |

* cited by examiner

*Primary Examiner* — Thuan Do
(74) *Attorney, Agent, or Firm* — Joan Pennington

(57) ABSTRACT

A method, system and computer program product are provided for implementing enhanced net routing for congestion resolution of non-rectangular or rectangular hierarchical macro designs of an integrated circuit chip. Congested macro nets near a macro boundary are identified. Wiring channels are reserved outside the macro boundary, allowing congested macro nets to be routed outside the physical boundary of the macro while still being logically contained within the macro.

20 Claims, 6 Drawing Sheets

IMPLEMENTING ENHANCED NET ROUTING CONGESTION RESOLUTION OF NON-RECTANGULAR OR RECTANGULAR HIERARCHICAL MACROS

FIELD OF THE INVENTION

The present invention relates generally to the data processing field, and more particularly, relates to a method, system and computer program product for implementing enhanced net routing congestion resolution of non-rectangular or rectangular hierarchical macro designs of an integrated circuit chip.

DESCRIPTION OF THE RELATED ART

Common electronic design automation (EDA) designs require rectilinear macros in hierarchical designs. Routing congestion typically is a problem around the boundary of the macro.

Known solutions to the routing congestion problem are to flatten the design, while drawbacks include non-parallel work, and the like; or to allow scenic routing and buffering, with drawbacks including increased power and static timing resource; or to modify the macro physical size and/or shape with drawbacks including cost, schedule, and the like.

A need exists for an efficient and effective mechanism for implementing enhanced net routing congestion resolution of non-rectangular or rectangular hierarchical macro designs of an integrated circuit chip.

SUMMARY OF THE INVENTION

A principal aspect of the present invention is to provide a method, system and computer program product for implementing enhanced net routing for congestion resolution of non-rectangular or rectangular hierarchical macro designs of an integrated circuit chip. Other important aspects of the present invention are to provide such method, system, and computer program product substantially without negative effects and that overcome many of the disadvantages of prior art arrangements.

In brief, a method, system and computer program product for implementing enhanced net routing for congestion resolution of non-rectangular or rectangular hierarchical macro designs of an integrated circuit chip. Congested macro nets near a macro boundary are identified. Wiring channels are reserved outside the macro boundary, allowing congested macro nets to be routed outside the physical boundary of the macro while still being logically contained within the macro.

In accordance with features of the invention, allowing the use of metal outside of the macro physical boundary enables more efficiently utilizing available routing channels as well as relieving routing congestion inside the macro.

In accordance with features of the invention, the identified congested macro nets are sized and routed using routing wiring channels at the parent or top level of hierarchy.

In accordance with features of the invention, the amount of top level routing resource to be allocated is determined by the number of congested nets identified and routed outside the boundary of the macro. The new macro routes outside the boundary of the macro then become metal blockage at the top level to prevent metal shorts between top level shapes and the macro routes.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, a system, and a computer program product are provided for implementing enhanced net routing for congestion resolution of non-rectangular or rectangular hierarchical macro designs of an integrated circuit chip.

In accordance with features of the invention, use of wiring metal outside of the macro physical boundary is provided for identified congested macro nets to more efficiently utilize available routing channels as well as relieve routing congestion inside the macro.

Figure 1:
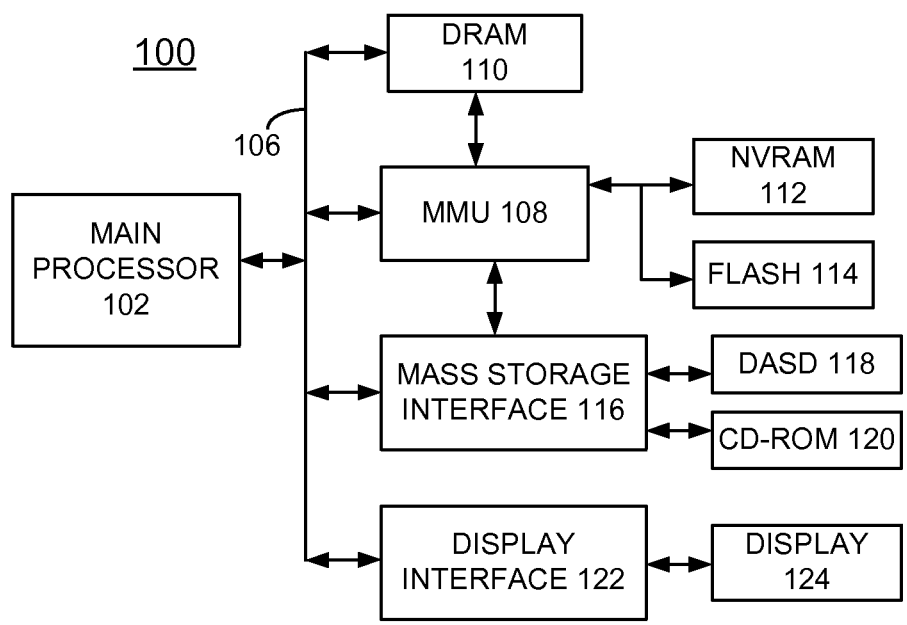
FIGS. 1 and 2 are block diagram representations illustrating an example computer system and operating system for implementing enhanced net routing for congestion resolution of non-rectangular or rectangular hierarchical macro designs of an integrated circuit chip in accordance with the preferred embodiment.
Figure 2:
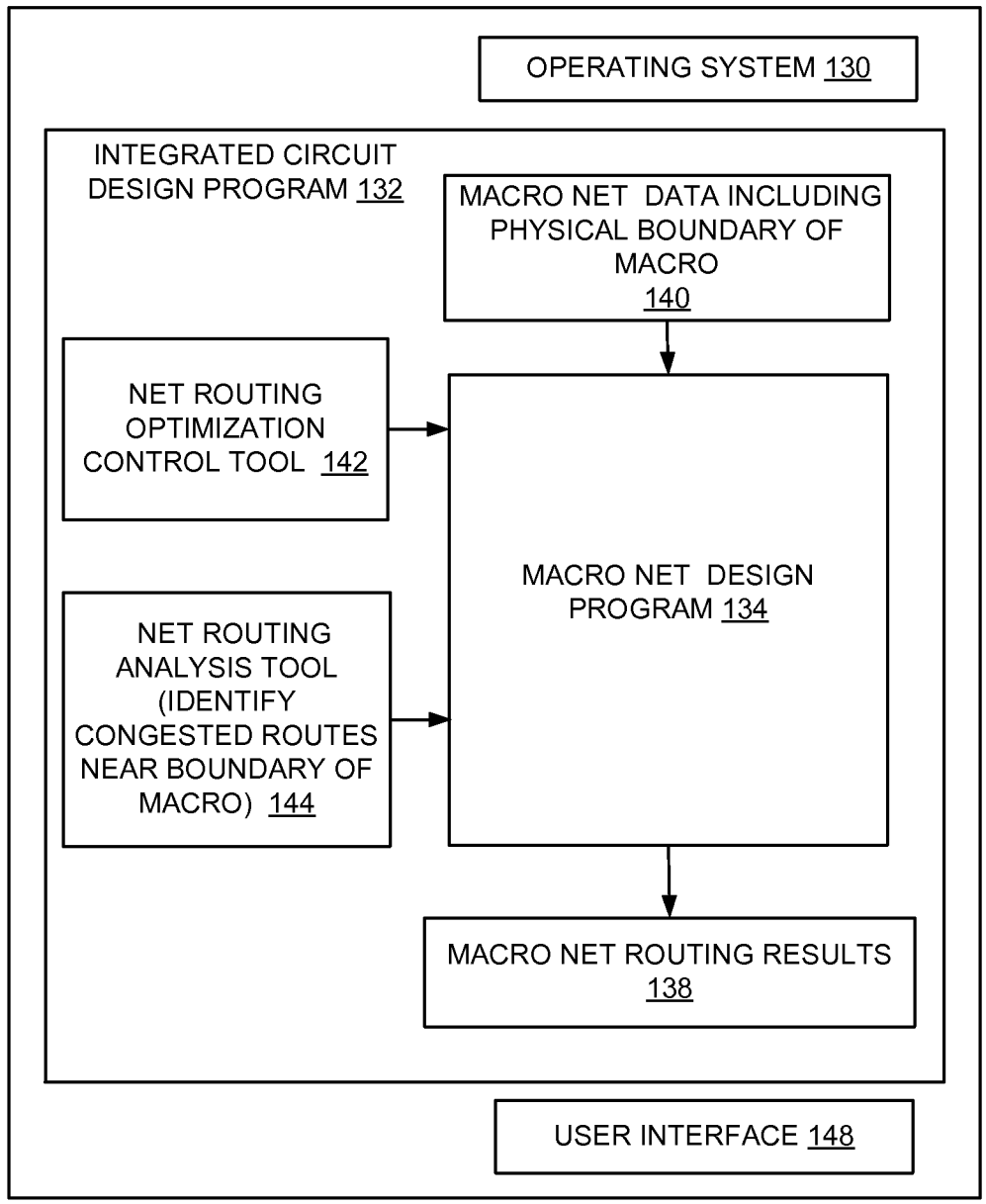

Referring now to the drawings, in FIGS. 1 and 2 there is shown a computer system generally designated by the reference character 100 for implementing enhanced net routing for congestion resolution of non-rectangular or rectangular hierarchical macro designs of an integrated circuit chip in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 2, computer system 100 includes an operating system 130, an integrated circuit design program 132, a macro net design program 134 of the preferred embodiment, providing macro net routing results 138, receiving macro net data including physical boundary of macro 140, and coupled to a net routing optimization control tool 142, and a net routing analysis tool 144 for identifying congested routes near the boundary of the macro, and a user interface 148.

Various commercially available computers can be used for computer system 100. CPU 102 is suitably programmed by the clock tree design 134 to execute the flowcharts of FIGS. 3 and 4 for implementing enhanced net routing for congestion resolution of non-rectangular or rectangular hierarchical macro designs of an integrated circuit chip, fore example, as illustrated in FIGS. 5A and 5B in accordance with the preferred embodiment.

In accordance with features of the invention, identified congested macro nets near the boundary of the macro are sized and routed using routing wiring channels at the parent or top level of hierarchy. The amount of top level routing resource to be allocated is determined by the number of congested nets identified and routed outside the boundary of the macro. The new macro wiring routes outside the boundary of the macro then become metal blockage at the top level to prevent metal shorts between top level shapes and the macro routes.

Figure 3:
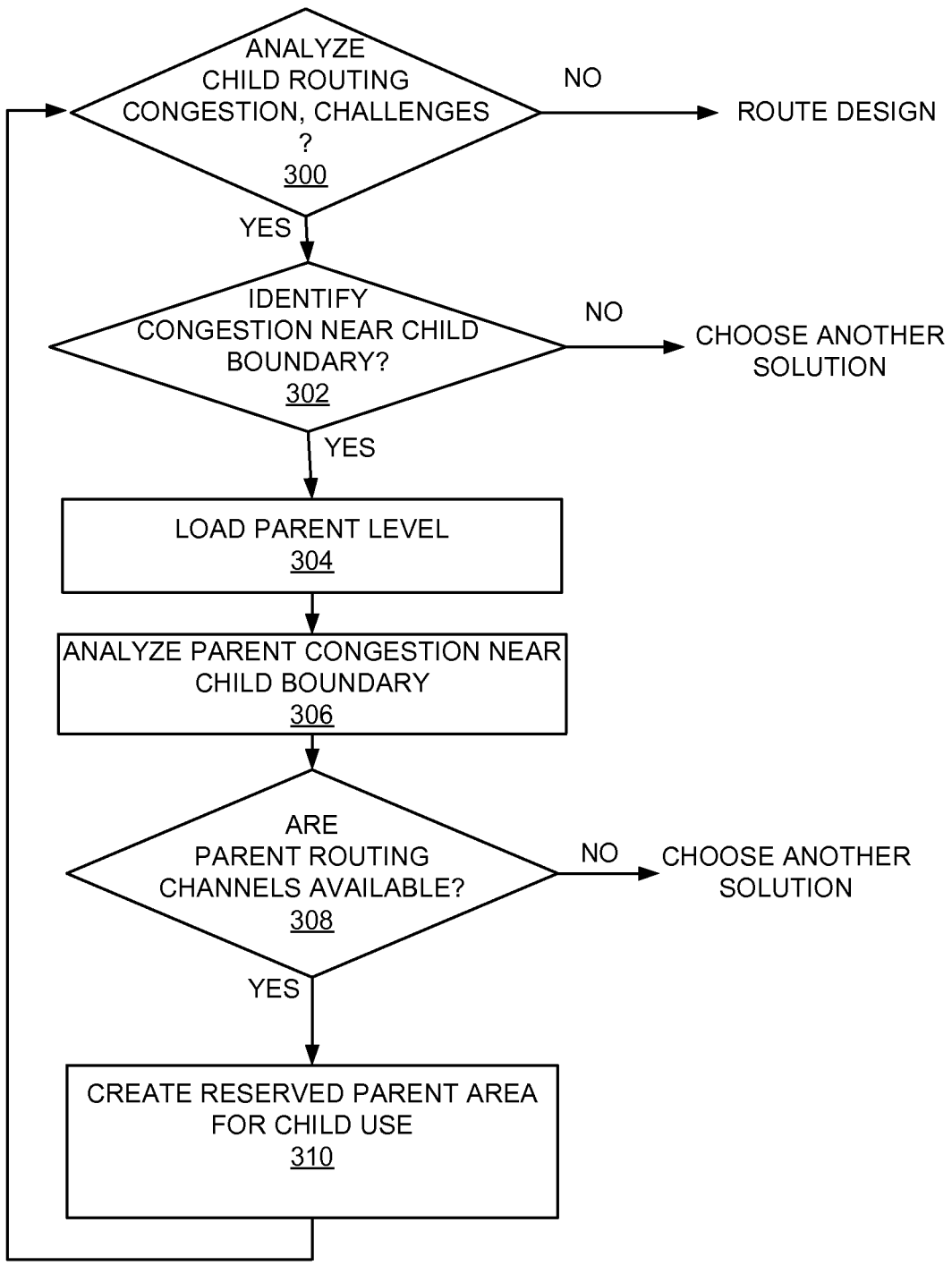
FIGS. 3 and 4 are flow charts illustrating example sequential steps for implementing enhanced net routing for congestion resolution of non-rectangular or rectangular hierarchical macro designs of an integrated circuit chip in accordance with the preferred embodiment.

Referring to FIG. 3, there are shown example steps for creating a child net abstraction reservation to parent to resolve child routing issues to implement enhanced net routing for congestion resolution of non-rectangular or rectangular hierarchical macro designs of an integrated circuit chip in accordance with the preferred embodiment. As indicated in a decision block 300, first child routing congestion is analyzed to identify challenges. When challenges are not identified in the analyzed child routing congestion, then routing for the design is performed.

Otherwise, when challenges are identified in the analyzed child routing congestion; then checking to identify congestion near a child boundary is performed as indicated in a decision block 302. For example, in the L-shaped macro congestion can occur near a child boundary going around the bend in the L as shown in FIGS. 5A and 5B, checking to identify congestion near the child boundary bend in the L is performed in decision block 302. When congestion near the child boundary is not identified, then another solution is selected.

When congestion near a child boundary is identified, then the parent or chip level is loaded as indicated in a block 304. Parent level congestion is analyzed near the child boundary as indicated in a block 306. When parent level congestion is identified near the child boundary, then checking for available parent routing channels is performed as indicated in a decision block 308. When available parent routing channels are not identified, then another solution is selected. When available parent routing channels are identified, then a reserved parent area for child use is created as indicated in a block 310. When the reserved parent area for child use is created, then the steps return to decision block 300 with child routing congestion analyzed to identify challenges and continue as described.

Figure 4:
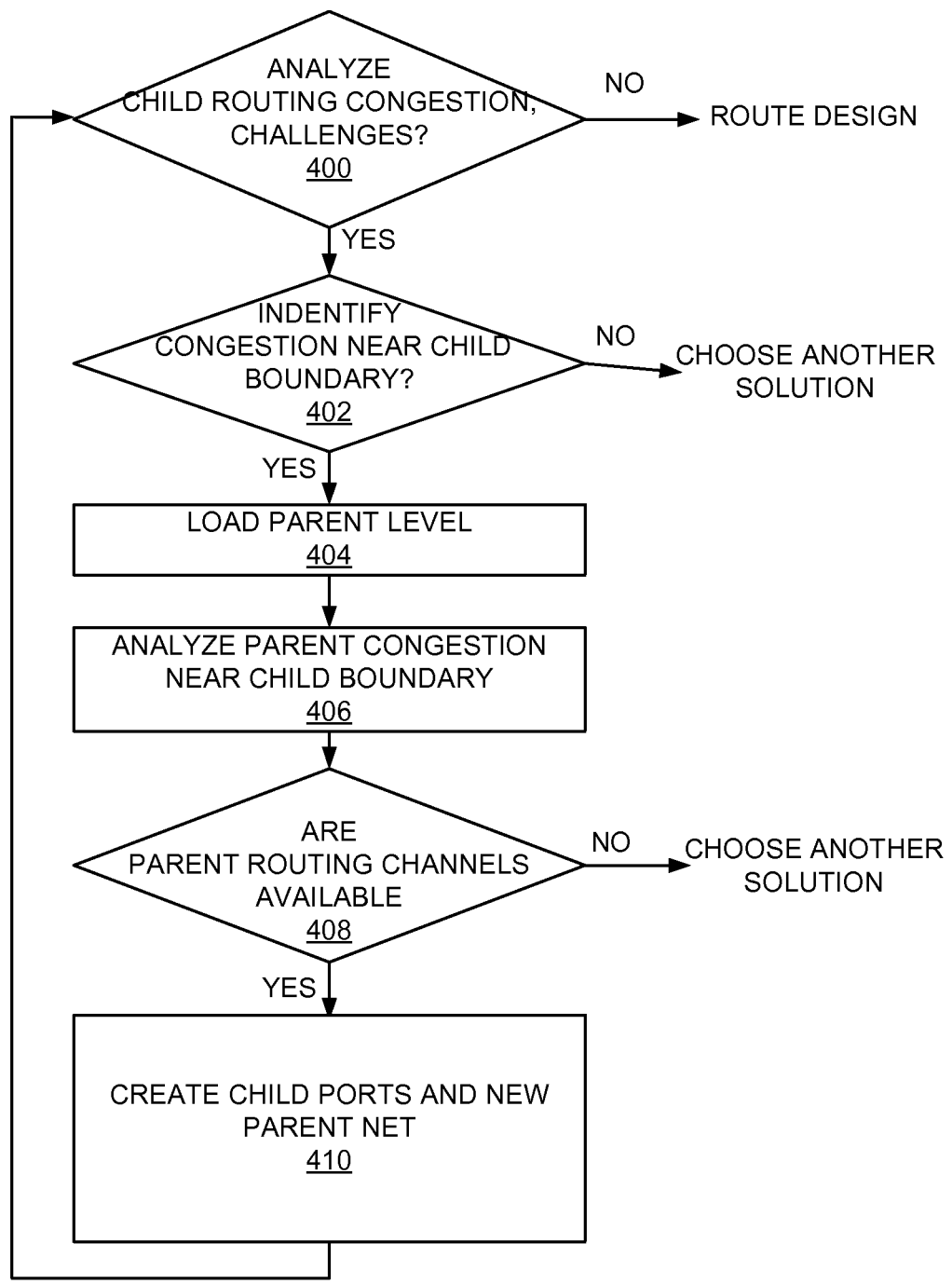
Figure 5A:
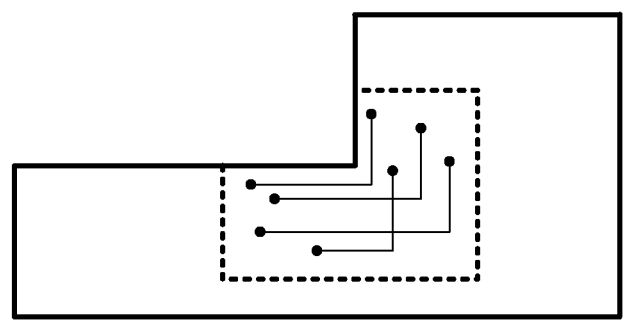
FIGS. 5A and 5B illustrate respective example macro net routings inside and outside a physical boundary of a macro design of an integrated circuit chip in accordance with the preferred embodiment.
Figure 5B:
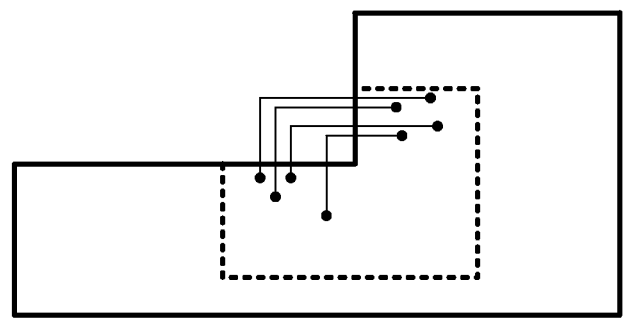

Referring to FIG. 4, there are shown example sequential steps for creating a child net propagation to parent level to resolve child routing to implement enhanced net routing for congestion resolution of non-rectangular or rectangular hierarchical macro designs of an integrated circuit chip in accordance with the preferred embodiment. As indicated in a decision block 300, first child routing congestion is analyzed to identify challenges. When challenges are not identified in the analyzed child routing congestion, then routing for the design is performed. Otherwise, when challenges are identified in the analyzed child routing congestion; then checking to identify congestion near a child boundary is performed as indicated in a decision block 402. For example, in the L-shaped macro congestion can occurs near a child boundary proximate or around the bend in the L as shown in FIGS. 5A and 5B, checking to identify congestion near the child boundary bend in the L is performed decision block 402. When congestion near the child boundary is not identified, then another solution is selected.

When congestion near a child boundary is identified, then the parent or chip level is loaded as indicated in a block 404. Parent level congestion is analyzed near the child boundary as indicated in a block 406. When parent level congestion is identified near the child boundary, then checking for available parent routing channels is performed as indicated in a decision block 408. When available parent routing channels are not identified, then another solution is selected. When available parent routing channels are identified, child ports and a new parent net are created as indicated in a block 410. When the child ports and the new parent net are created, then the steps return to decision block 400 with child routing congestion analyzed to identify challenges and continue as described above.

Referring to FIGS. 5A and 5B, there are shown respective example macro net routings inside and outside a physical boundary of a macro design of an integrated circuit chip in accordance with the preferred embodiment.

In FIG. 5A, an example macro design generally designated by the reference character 500 includes example macro net routings inside the physical boundary of macro.

In FIG. 5B, an example macro design generally designated by the reference character 510 includes example macro net routings outside the physical boundary of macro in accordance with the preferred embodiment.

Figure 6:
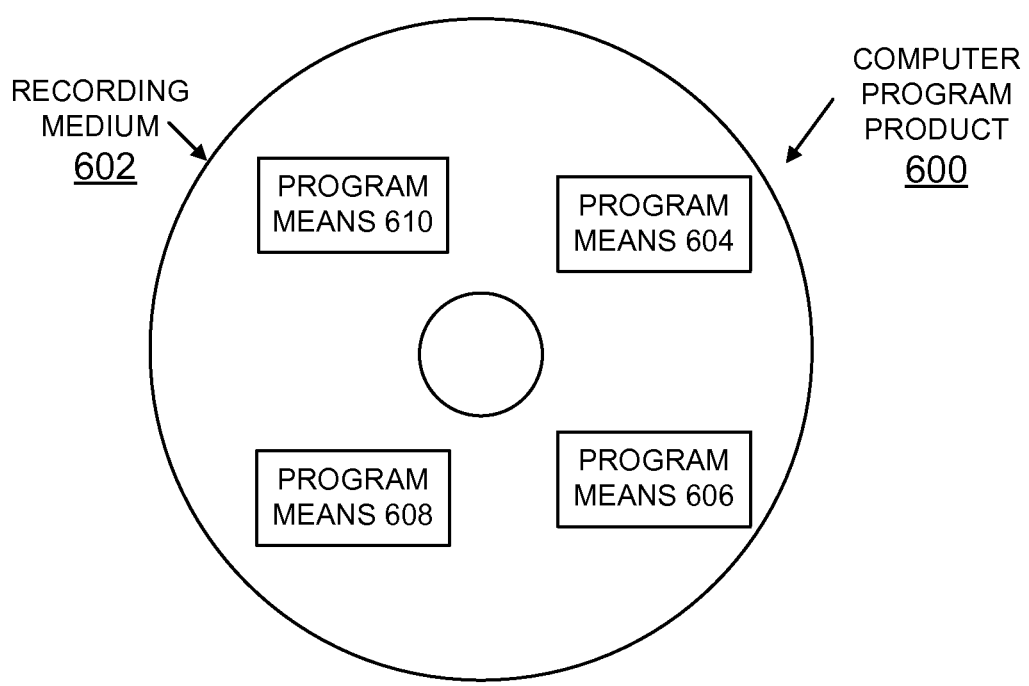
FIG. 6 is a block diagram illustrating a computer program product in accordance with the preferred embodiment.

Referring now to FIG. 6, an article of manufacture or a computer program product 600 of the invention is illustrated. The computer program product 600 includes a recording medium 602, such as, a floppy disk, a high capacity read only memory in the form of an optically read compact disk or CD-ROM, a tape, or another similar computer program product. Recording medium 602 stores program means 604, 606, 608, 610 on the medium 602 for carrying out the methods for implementing enhanced net routing for congestion resolution of non-rectangular or rectangular hierarchical macro designs of an integrated circuit chip of the preferred embodiment in the system 100 of FIG. 1.

A sequence of program instructions or a logical assembly of one or more interrelated modules defined by the recorded program means 604, 606, 608, 610, direct the computer system 100 for implementing enhanced net routing for congestion resolution of non-rectangular or rectangular hierarchical macro designs of an integrated circuit chip of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing enhanced net routing for congestion resolution of non-rectangular or rectangular hierarchical macro designs of an integrated circuit chip comprising:

a computer system performing method steps of:

receiving macro net data including a physical boundary of a macro; said macro including a non-rectangular or rectangular hierarchical macro design;

identifying congested child macro nets near a macro boundary by analyzing child routing congestion within said macro; and analyzing parent routing congestion near said macro boundary and reserving wiring channels outside the macro boundary, allowing congested child macro nets to be routed outside the physical boundary of said macro while still being logically contained within said macro; said reserved wiring channels implementing the identified congested child macro nets near said macro boundary.

2. The computer-implemented method as recited in claim 1 wherein identifying congested child macro nets near a macro boundary includes analyzing child routing congestion for challenges.

3. The computer-implemented method as recited in claim 2 includes identifying child routing congestion with challenges near a child boundary.

4. The computer-implemented method as recited in claim 3 includes loading parent routing level and identifying parent routing congestion near the child boundary, and identifying parent routing channels available.

5. The computer-implemented method as recited in claim 4 wherein reserving wiring channels outside the macro boundary includes creating a reserved parent area for child use.

6. The computer-implemented method as recited in claim 5 includes sizing and routing identified child routing congestion with challenges near the child boundary using routing wiring channels at the parent or top level of the hierarchical macro design.

7. The computer-implemented method as recited in claim 5 includes determining an amount of top level routing resource to be allocated by an identified number of identified congested child nets and routed outside the boundary of the macro.

8. An integrated circuit design computer program product for implementing enhanced net routing for congestion resolution of non-rectangular or rectangular hierarchical macro designs of an integrated circuit chip in a computer system, said computer program product tangibly embodied in a non-transitory machine readable medium used in the integrated circuit design process, said integrated circuit design computer program product including a macro net design program, said integrated circuit design computer program product including instructions executed by the computer system to cause the computer system to perform the steps of:

receiving macro net data including a physical boundary of a macro; said macro including a non-rectangular or rectangular hierarchical macro design;

identifying congested child macro nets near a macro boundary by analyzing child routing congestion within said macro; and analyzing parent routing congestion near said macro boundary and reserving wiring channels outside the macro boundary, allowing congested child macro nets to be routed outside the physical boundary of said macro while still being logically contained within said macro; said reserved wiring channels implementing the identified congested child macro nets near said macro boundary.

9. The integrated circuit design computer program product as recited in claim 8 wherein identifying congested child macro nets near a macro boundary includes analyzing child routing congestion for challenges.

10. The integrated circuit design computer program product as recited in claim 9 includes identifying child routing congestion with challenges near a child boundary.

11. The integrated circuit design computer program product as recited in claim 10 includes loading parent routing level and identifying parent routing congestion near the child boundary, and identifying parent routing channels available.

12. The integrated circuit design computer program product as recited in claim 11 wherein reserving wiring channels outside the macro boundary includes creating reserved parent area for child use.

13. The integrated circuit design computer program product as recited in claim 12 includes creating child ports and a new parent net.

14. The integrated circuit design computer program product as recited in claim 12 includes sizing and routing identified child routing congestion with challenges near the child boundary using routing wiring channels at the parent level of the hierarchical macro design.

15. A system for implementing enhanced net routing for congestion resolution of non-rectangular or rectangular hierarchical macro designs of an integrated circuit chip comprising:

a processor, an integrated circuit design program tangibly embodied in a machine readable medium used in the integrated circuit design process, said integrated circuit design program including a macro net design program, and said processor identifying congested macro nets near a macro boundary; and said processor analyzing parent routing congestion near said macro boundary and reserving wiring channels outside the macro boundary, allowing congested child macro nets to be routed outside the physical boundary of said macro while still being logically contained within said macro; said reserved wiring channels implementing the identified congested child macro nets near said macro boundary.

16. The system as recited in claim 15 wherein said processor identifying congested child macro nets near a macro boundary includes said processor analyzing child routing congestion for challenges.

17. The system as recited in claim 16 includes said processor identifying child routing congestion with challenges near a child boundary.

18. The system as recited in claim 17 includes said processor loading parent routing level and identifying parent routing congestion near the child boundary, and identifying parent routing channels available.

19. The system as recited in claim 18 wherein said processor reserving wiring channels outside the macro boundary includes said processor creating reserved parent area for child use.

20. The system as recited in claim 19 includes said processor sizing and routing identified child routing congestion with challenges near the child boundary using routing wiring channels at the parent level of the hierarchical macro design.

* * * * *